(12) United States Patent
Huang et al.

(10) Patent No.: US 6,218,275 B1
(45) Date of Patent: *Apr. 17, 2001

(54) PROCESS FOR FORMING SELF-ALIGNED CONTACT OF SEMICONDUCTOR DEVICE

(75) Inventors: Jing-Xian Huang; Jacson Liu, both of Hsinchu (TW)

(73) Assignee: Mosel Vitelic, Inc. (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/406,556

(22) Filed: Sep. 27, 1999

(30) Foreign Application Priority Data

May 13, 1999 (TW) .................................................. 88107795

(51) Int. Cl.[7] .................. H01L 21/3205; H01L 21/4763; H01L 21/8238; H01L 21/8234; H01L 21/336
(52) U.S. Cl. .......................... 438/595; 438/197; 438/199; 438/230; 438/233; 438/622; 438/637; 438/666; 438/696; 438/634; 438/749
(58) Field of Search ...................... 438/595, 592, 438/585, 586, 305, 306, 307, 597, 599, 634, 636, 637–639, 622, 624, 666, 667, 197, 199, 200, 233, 646, 734–738, 749–751

(56) References Cited

U.S. PATENT DOCUMENTS

| | | | |
|---|---|---|---|
| 5,500,382 | * 3/1996 | Wei | 438/586 |
| 5,731,242 | * 3/1998 | Parat et al. | 438/586 |
| 5,814,553 | * 9/1998 | Chuang et al. | 438/595 |
| 5,817,562 | * 10/1998 | Chang et al. | 438/305 |
| 5,960,270 | * 9/1999 | Misra et al. | 438/197 |
| 5,989,987 | * 10/1999 | Kuo | 438/592 |

* cited by examiner

Primary Examiner—Charles Bowers
Assistant Examiner—Thanhha Pham
(74) Attorney, Agent, or Firm—Laff, Whitesel & Saret, Ltd.; J. Warren Whitesel

(57) ABSTRACT

A process for forming a contact structure of a semiconductor device includes the steps of (a) providing a substrate having a plurality of gates thereon and a first oxide layer formed between the gates, (b) forming a first dielectric layer on the oxide layer and the gates, (c) forming a second oxide layer on the first dielectric layer, and (d) removing a portion of the second oxide layer for forming first spacers alongside each of the gates. The process further includes steps of (e) removing a portion of the first dielectric layer and the first oxide layer to expose a portion of the substrate by using the first spacers as a mask for forming second spacers alongside each of the gates, (f) forming a second dielectric layer over the exposed portion of the substrate, the second spacers, and the gates, (g) forming a third dielectric layer over the second dielectric layer, and (h) executing a photolithographic and etching process on the third dielectric layer and the second dielectric layer to form the contact structure between the gates on the substrate.

19 Claims, 4 Drawing Sheets

PROCESS FOR FORMING SELF-ALIGNED CONTACT OF SEMICONDUCTOR DEVICE

FIELD OF THE INVENTION

The present invention is related to a process for forming a contact structure of a semiconductor device, and more particularly to a process for forming a self-aligned contact hole on a metal-oxide-semiconductor (MOS) transistor.

BACKGROUND OF THE INVENTION

The size of an integrated circuit is getting smaller and smaller, but the requirement of the integration level is generally raised. In a process for manufacturing a semiconductor device, the accuracy of a photolithographic process is limited by the resolution. It is not easy to precisely define a contact structure of the semiconductor device when the device is small. Therefore, a self-aligned contact (SAC) process is developed and widely used in the semiconductor manufacturing process.

Please refer to FIGS. 1(a)~(h) which schematically show the steps for manufacturing a contact plug between two MOS transistors by the self-aligned contact process of the prior art. Referring to FIG. 1(a), a plurality of gates of the MOS transistor is formed on the substrate 10. Each gate includes a polycide layer 12 and a first silicon nitride layer 13 formed on the polycide layer 12. A first oxide layer 11 is formed on the substrate 10 by a rapid thermal process (RTP). Referring to FIG. 1(b), a second silicon nitride layer 14 is formed over the first oxide layer 11 and the gates. The second silicon nitride layer 14 is formed by low pressure chemical vapor deposition (LPCVD). Referring to FIG. 1(c), portions of the second silicon nitride layer 14 and the first oxide layer 11 are removed by an etching process. After the residual portion of the first oxide layer 11 is removed by an acid solution, spacers 15 are formed on sidewalls of the gates. The acid solution is usually hydrofluoric acid.

Please refer to FIGS. 1(d)~(h) which shows the steps of the self-aligned contact process. In FIG. 1(d), a first dielectric layer 16 is formed on the gates and the spacers 15 by chemical vapor deposition (CVD). The dielectric layer 16 can be a silicon nitride layer or a silicon oxynitride layer. In FIG. 1(e), a second oxide layer 17 is formed over the dielectric layer 16 by another CVD process. Thereafter, a photoresist layer 18 is formed on the second oxide layer 17. The photoresist layer is patterned by a photolithographic process and a portion of the second oxide layer 19 will be exposed as shown in FIG. 1(f). A contact hole 20 is formed after the exposed portion of the second oxide layer 19, and portions of the first dielectric layer 16 and spacers 15 are removed by an anisotropic etching process. The residual photoresist layer is removed by SPM (Sulfuric acid and hydrogen peroxide). A polysilicon layer 21 is formed between two gates by a CVD process. Finally, a polysilicon contact plug 21 is formed for connecting the source region and the drain region (not shown) of the MOS transistor.

The spacers 15 are made of silicon nitride, the first dielectric layer 16 is a silicon nitride layer or a silicon oxynitride layer, and the second oxide layer 17 is a silicon oxide layer. The etching selectivity ratio of silicon oxide to silicon nitride or silicon oxynitride is relatively high. Therefore, the first silicon nitride layer 13 of the gate, the spacers 15, and the first dielectric layer 16 will not be totally removed by the etching process for removing the second oxide layer 17. A short circuit between the polysilicon contact plug 21 and the polycide layer 12 of the gate will not occur. In addition, the opening of the photoresist layer 18 is not necessary to be precisely aligned between two gates of the MOS transistor because of the high etching selectivity ratio. Moreover, the width B of the opening 19 can be greater than the distance A between two gates.

Referring to FIG. 1(h), the length L is the shortest distance between the polysilicon contact plug 21 and the polycide layer 12. When the size of the semiconductor device is reduced, the length L is also reduced. However, the resolution of the photolithographic process is limited, so that the width B of the opening 19 can not be reduced. Therefore, the width B may be much greater than the distance A between two gates, and the length L will become very small after the etching process. However, a short circuit will be occurred between the polysilicon contact plug 21 and the polycide layer 12 if the length L is too small. Therefore, it is desirable to develop a method for solving the problems encountered with the prior art.

SUMMARY OF THE INVENTION

An object of the present invention is to provide a process for forming a contact structure of a semiconductor device.

Another object of the present invention is to provide a self-aligned contact process for forming a self-aligned contact hole on a MOS transistor.

According to the present invention, the process for forming a contact structure of a semiconductor device includes steps of (a) providing a substrate having a plurality of gates thereon and a first oxide layer formed between the gates, (b) forming a first dielectric layer on the oxide layer and the gates, (c) forming a second oxide layer on the first dielectric layer, and (d) removing a portion of the second oxide layer for forming first spacers alongside each of the gates. The process further includes steps of (e) removing a portion of the first dielectric layer and the first oxide layer to expose a portion of the substrate by using the first spacers as a mask for forming second spacers alongside each of the gates, (f) forming a second dielectric layer over the exposed portion of the substrate, the second spacers, and the gates, (g) forming a third dielectric layer over the second dielectric layer, and (h) executing a photolithographic and etching process on the third dielectric layer to form the contact structure between the gates on the substrate.

The semiconductor device includes a plurality of metal oxide semiconductor (MOS) transistors. Each of the MOS transistors includes a source, a drain, and the gate. Each of the gates includes a conducting layer and a silicon nitride layer formed on the conducting layer. The conducting layer is a polycide layer.

After the step (h), the process further includes a step (i) of depositing a polysilicon layer over the third dielectric layer and the contact structure for forming a polysilicon contact plug connected with one of the source and the drain of the MOS transistor. Certainly, the first dielectric layer can be a silicon nitride layer and the second oxide layer can be a silicon oxide layer. The second dielectric layer is one selected from a silicon nitride layer and a silicon oxynitride layer, and the third dielectric layer can be a silicon oxide layer.

According to the present invention, the steps (b) and (c) are executed by low pressure chemical vapor deposition (LPCVD). The steps (d) and (e) are respectively executed by an anisotropic etching process. The step (e) further includes a step of removing the first spacers and a portion of the first oxide layer to expose a portion of substrate by using an acid solution after the second spacers are formed. The acid solution of step (e) is one selected from hydrofluoric acid (HF) and sulfuric acid ($H_2SO_4$). In addition, the step (f) is executed by low pressure chemical vapor deposition (LPCVD), and the step (g) is executed by chemical vapor deposition (CVD).

According to the present invention, the step (h) includes steps of (h1) forming a photoresist layer on the third dielectric layer, (h2) removing a portion of the photoresist layer to expose a portion of the third dielectric layer, (h3) removing the exposed portion of the third dielectric layer, a portion of the second spacers, and a portion of the second dielectric layer not covered by the photoresist layer to expose a portion of the substrate, and (h4) removing the photoresist layer by using an acid solution for forming the contact structure between the gates. The width of the exposed portion of the third dielectric layer is substantially larger than a distance between the gates. The contact structure formed by the step (h) is a self-aligned contact hole. The step (h3) is executed by an anisotropic etching process. Besides, the acid solution of the step (h4) is sulfuric acid ($H_2SO_4$).

The present invention may best be understood through the following description with reference to the accompanying drawings, in which:

DETAILED DESCRIPTION OF THE PREFERRED EMBODIMENTS

Please refer to FIGS. 2 (a)~(g) which are schematic diagrams showing the steps of the self-aligned contact (SAC) process according to the present invention. A contact plug can be formed between two MOS transistors by the SAC process.

Figure 1A:
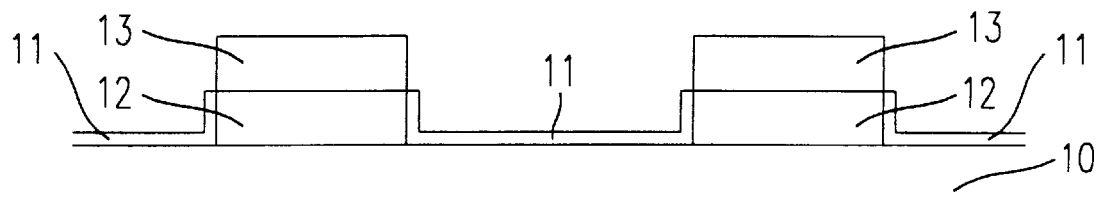
FIGS. 1 (a)~(h) are schematic diagrams showing the steps of a self-aligned contact (SAC) process for forming a contact structure in the prior art.
Figure 1B:
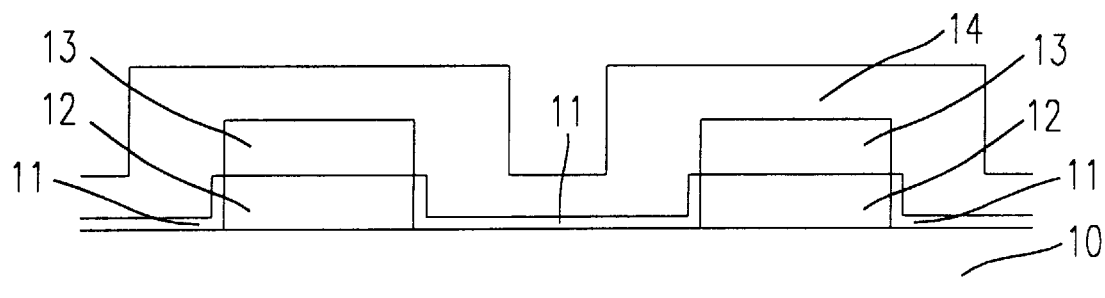
Figure 1C:
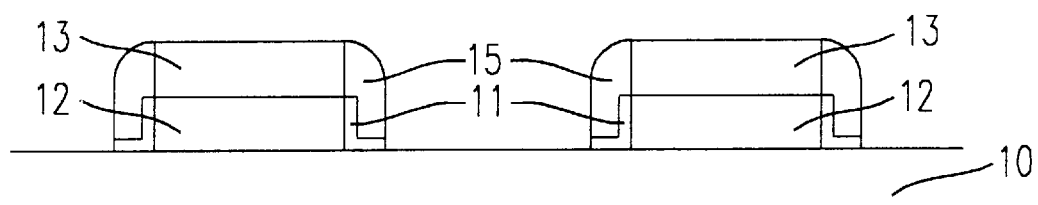
Figure 1D:
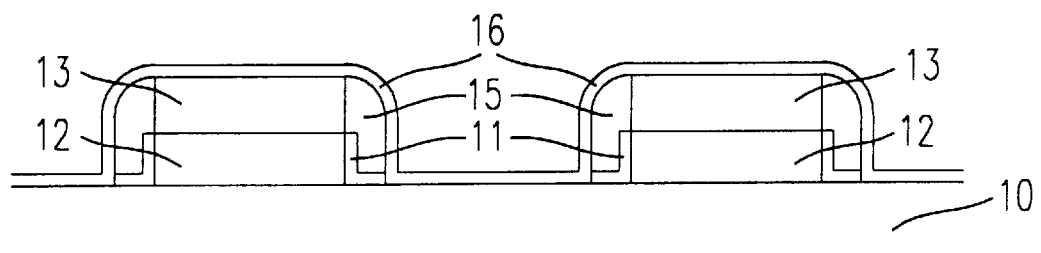
Figure 1E:
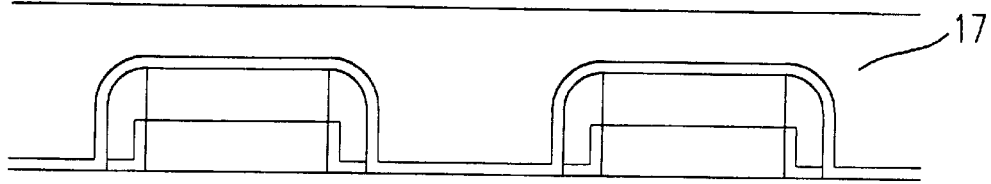
Figure 1F:
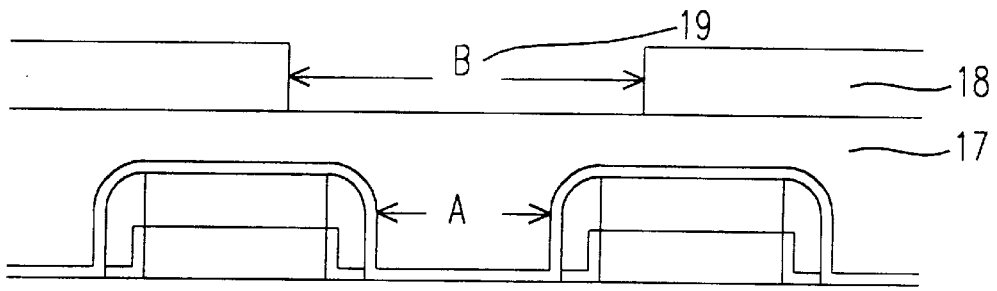
Figure 1G:
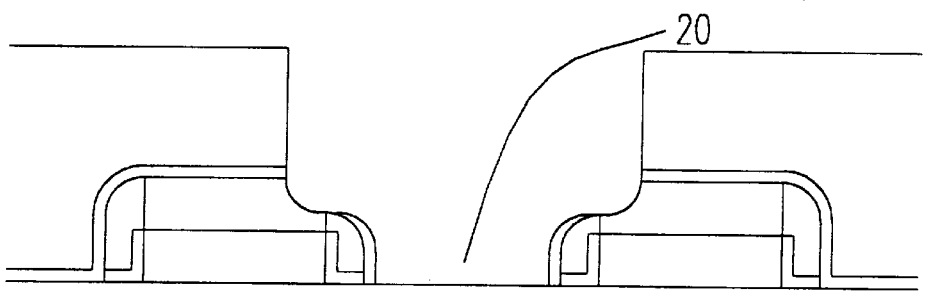
Figure 1H:
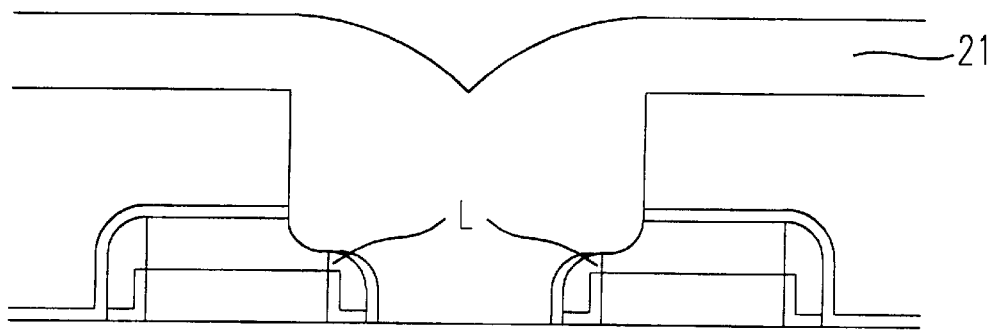
Figure 2A:
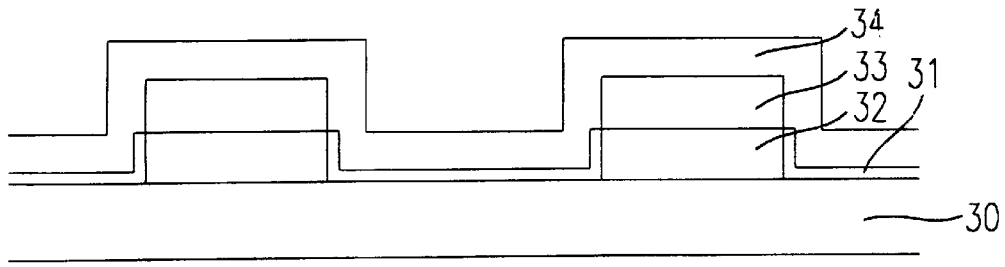
FIGS. 2 (a)~(g) are schematic diagrams showing the steps of a self-aligned contact (SAC) process for forming a contact structure according to the present invention.

Referring to FIG. 2(a), two metal oxide semiconductor (MOS) transistors are formed on the substrate 30. Each of the MOS transistors includes a source, a drain, and a gate. The gate includes a conducting layer 32 and a silicon nitride layer 33 formed on the conducting layer 32. The conducting layer 32 is a polycide layer. A first oxide layer 31 is formed between the gates on the substrate 30 by a rapid thermal process (RTP). A first dielectric layer 34 is then formed over the first oxide layer 31 and these gates. The first dielectric layer 34 is a silicon nitride layer.

Figure 2B:
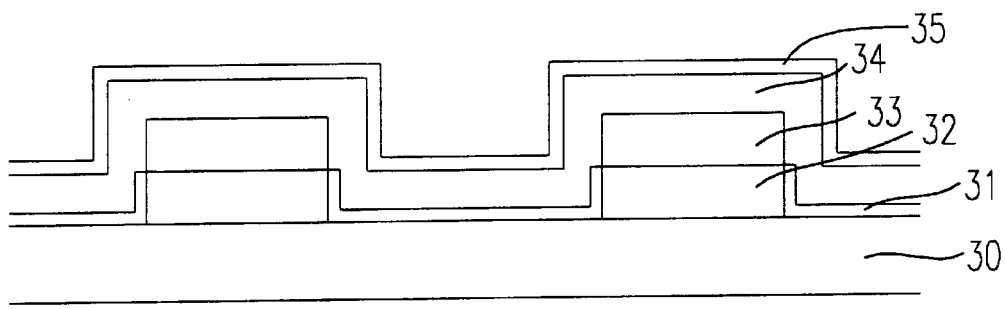

Referring to FIG. 2(b), a second oxide layer 35 is formed over the first dielectric layer 34. Both of the first dielectric layer 34 and the second oxide layer 35 are formed by low pressure chemical vapor deposition (LPCVD).

Figure 2C:
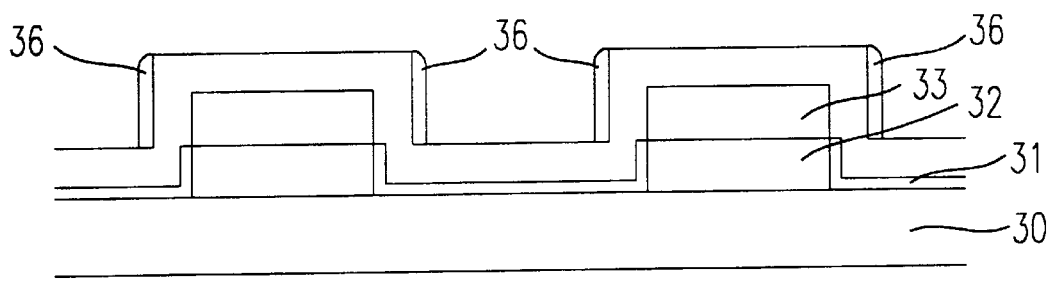
Figure 2D:
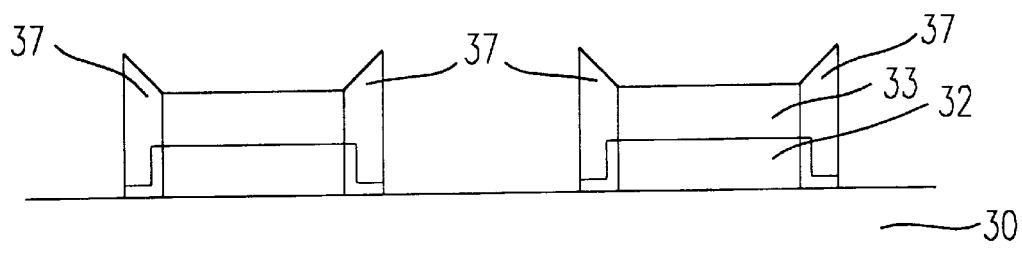

Referring to FIG. 2(c), a portion of the second oxide layer 35 is removed by an anisotropic etching process to form first spacers 36 alongside each of the gates. By using the first spacers 36 as a mask, the first dielectric layer 34 is particularly removed by another anisotropic etching process. The residual first spacers and the first oxide layer 31 are then removed by an acid solution containing hydrofluoric acid. A portion of the substrate 30 is then exposed and the second spacers 37 are formed on each sidewall of each gate. The first spacer 36 is made of silicon oxide and the first dielectric layer 34 is made of silicon nitride. Because the etching selectivity ratio of the silicon oxide to silicon nitride is high, the protrusive second spacers 37 are formed as shown in FIG. 2(d).

Figure 2E:
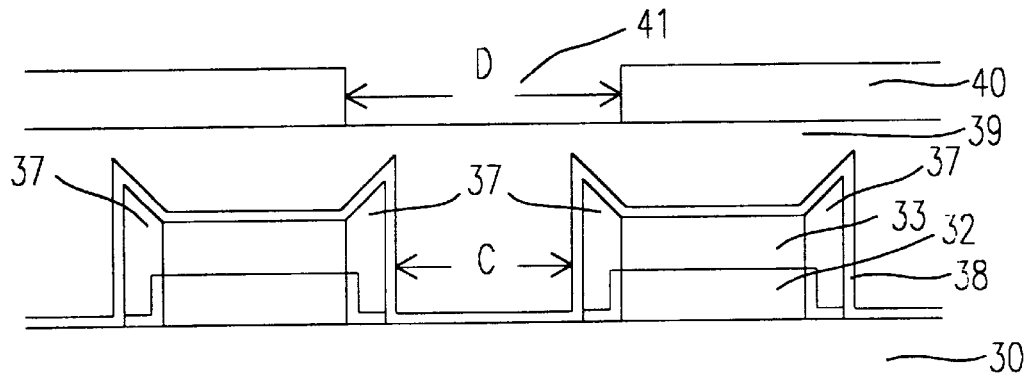

Referring to FIG. 2(e), a second dielectric layer 38 is formed over the exposed portion of the substrate, the second spacers 37, and these gates. A third dielectric layer 39 is formed on the second dielectric layer 38. The second dielectric layer 38 is formed by low pressure chemical vapor deposition (LPCVD). In addition, the third dielectric layer 39 is formed by chemical vapor deposition (CVD). The second dielectric layer 38 can be a silicon nitride layer or a silicon oxynitride layer. The third dielectric layer 39 is a silicon oxide layer. The third dielectric layer 39 is particularly removed by a photolithographic and etching process to form the contact structure between the gates on the substrate.

In the photolithographic and etching process, a photoresist layer 40 is first formed above the third dielectric layer 39. Preferably, an anti-reflection layer (not shown) is formed under the photoresist layer 40 for improving the resolution of the photolithographic process. Thereafter, a portion of the photoresist layer 40 is removed and a portion of the third dielectric layer 39 is then exposed. The width D of the opening 41 is substantially larger than a distance C between the gates.

Figure 2F:
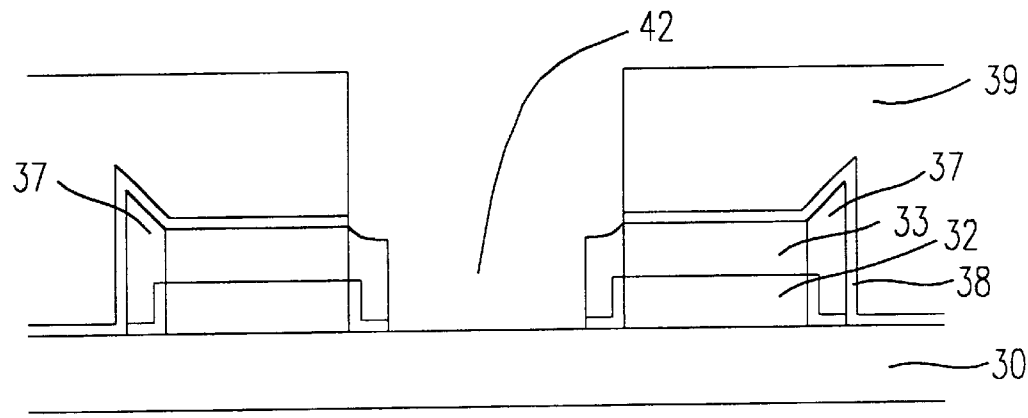

Referring to FIG. 2(f), the exposed portion of the third dielectric layer, a portion of the second spacers, and portions of the second dielectric layer not covered by the photoresist layer are removed by a third anisotropic etching process. A portion of the substrate is then exposed. The source/drain regions of the MOS transistor are located below the exposed substrate. After the residual photoresist layer is removed by using an acid solution, a contact structure 42 is formed between the gates. The contact structure 42 is a self-aligned hole structure. The acid solution is sulfuric acid ($H_2SO_4$).

Figure 2G:
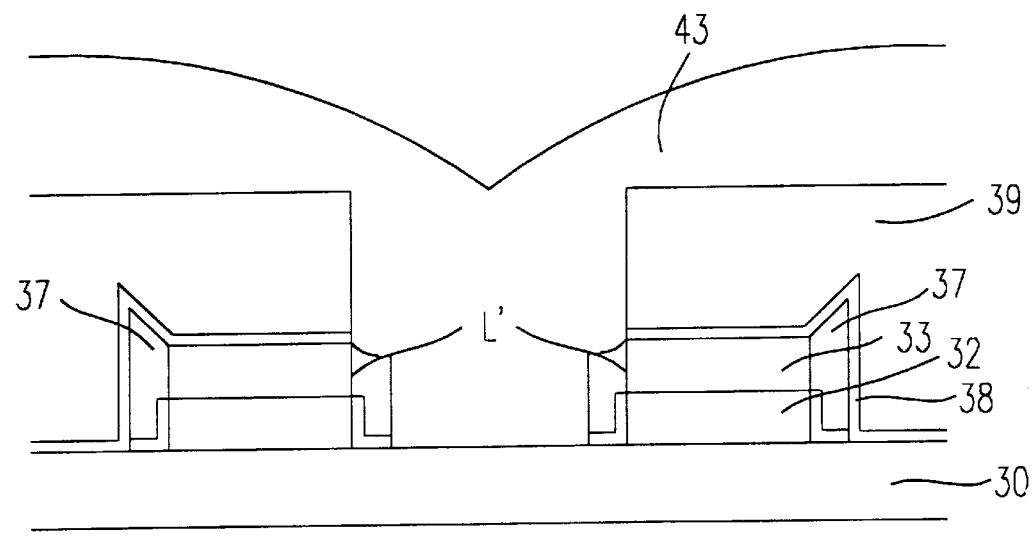

Referring to FIG. 2(g), a polysilicon layer 43 is finally deposited over the third dielectric layer 39 and in the contact hole 42, and then a polysilicon contact plug 43 is formed for connecting the source and the drain of the MOS transistor. The polysilicon layer 43 is deposited by chemical vapor deposition (CVD).

In conclusion, the distance L' between the polysilicon contact plug 43 and the polycide layer 32 is larger because of the protrusive second spacer 37 as compared with that of the prior art. The shape of the second spacer 37 is formed due to the high etching selectivity ratio between silicon oxide (first space 36) and silicon nitride (first dielectric layer 34). Therefore, the short circuit between the polysilicon contact plug 43 and the polycide layer 32 will be reduced because the distance between them is longer. Further, the short circuit will not be happened even though the width 41 of the exposed portion of the third dielectric layer 39 is greater than that of the prior art.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a contact structure of a semiconductor device comprising steps of:

(a) providing a substrate having a plurality of gates thereon and a first oxide layer formed between said gates;

(b) forming a first dielectric layer on said first oxide layer and said gates;

(c) forming a second oxide layer on said first dielectric layer;

(d) removing a portion of said second oxide layer for forming first spacers alongside each of said gate;

(e) removing a portion of said first dielectric layer by using said first spacers as a mask for forming second spacers alongside each of said gates, wherein said second spacers protrude outwardly from said gates;

(f) removing said first spacers and said first oxide layer to expose a portion of said substrate by using an acid solution after said second spacers are formed;

(g) forming a second dielectric layer over said exposed portion of said substrate, said second spacers, and said gates;

(h) forming a third dielectric layer over said second dielectric layer; and (i) executing a photolithographic and etching process on said third dielectric layer and said second dielectric layer to form said contact structure between said gates on said substrate.

2. The process according to claim 1 wherein said semiconductor device includes a plurality of metal oxide semiconductor (MOS) transistors.

3. The process according to claim 2 wherein each of said MOS transistors includes a source, a drain, and said gate.

4. The process according to claim 3, after said step (i), further comprising a step (j) of depositing a polysilicon layer over said third dielectric layer and said contact structure for forming a polysilicon contact plug connected with one of said source and said drain of said MOS transistor.

5. The process according to claim 1 wherein said steps (b) and (c) are executed by low pressure chemical vapor deposition (LPCVD).

6. The process according to claim 1 wherein said first dielectric layer is a silicon nitride layer.

7. The process according to claim 1 wherein said second oxide layer is a silicon oxide layer.

8. The process according to claim 1 wherein said steps (d) and (e) are respectively executed by an anisotropic etching process.

9. The process according to claim 1 wherein said acid solution is one selected from hydrogen fluoride acid (HF) and sulfuric acid ($H_2SO_4$).

10. The process according to claim 1 wherein said step (g) is executed by low pressure chemical vapor deposition (LPCVD).

11. The process according to claim 1 wherein said step (h) is executed by chemical vapor deposition (LPCVD).

12. The process according to claim 1 wherein said second dielectric layer is one selected from a silicon nitride layer and a silicon oxynitride layer.

13. The process according to claim 1 wherein said third dielectric layer is a silicon oxide layer.

14. The process according to claim 1 wherein each of said gate includes a conducting layer and a silicon nitride layer formed on said conducting layer.

15. The process according to claim 14 wherein said conducting layer is a polycide layer.

16. The process according to claim 1 wherein said step (i) includes further steps of:

(i1) forming a photoresist layer on said third dielectric layer;

(i2) removing a portion of said photoresist layer to expose a portion of said third dielectric layer, wherein the width of said exposed portion of said third dielectric layer is substantially larger than a distance between said gates;

(i3) removing said exposed portion of said third dielectric layer, a portion of said second spacers, and a portion of said second dielectric layer not covered by said photoresist layer to expose a portion of said substrate; and (i4) removing said photoresist layer by using an acid solution for forming said contact structure between said gates.

17. The process according to claim 16 wherein said contact structure is a self-aligned contact hole.

18. The process according to claim 16 wherein said step (i3) is executed by an anisotropic etching process.

19. The process according to claim 16 wherein said acid solution of said step (i4) is sulfuric acid ($H_2SO_4$).

* * * * *